(12) United States Patent
Cristoloveanu et al.

(10) Patent No.: US 9,166,051 B2
(45) Date of Patent: Oct. 20, 2015

(54) RAM MEMORY CELL COMPRISING A TRANSISTOR

(75) Inventors: Sorin Ioan Cristoloveanu, Seyssinet (FR); Noel Rodriguez, Armilla (ES); Francisco Gamiz, Armilla (ES)

(73) Assignees: Centre National de la Recherche Scientifique (FR); Universidad de Granada (ES)

( * ) Notice: Subject to any disclaimer, the term of this patent is extended or adjusted under 35 U.S.C. 154(b) by 39 days.

(21) Appl. No.: 13/639,672

(22) PCT Filed: Apr. 7, 2011

(86) PCT No.: PCT/FR2011/050788
§ 371 (c)(1),
(2), (4) Date: Feb. 15, 2013

(87) PCT Pub. No.: WO2011/124855
PCT Pub. Date: Oct. 13, 2011

(65) Prior Publication Data
US 2013/0148441 A1 Jun. 13, 2013

(30) Foreign Application Priority Data

Apr. 7, 2010 (FR) ..................... 10 52612

(51) Int. Cl.
| | | |
|---|---|---|
| *G11C 11/34* | (2006.01) | |
| *H01L 29/78* | (2006.01) | |
| *G11C 11/404* | (2006.01) | |

(Continued)

(52) U.S. Cl.
CPC ............... *H01L 29/785* (2013.01); *G11C 7/00* (2013.01); *G11C 11/404* (2013.01); *H01L 21/84* (2013.01); *H01L 21/845* (2013.01); *H01L 27/10802* (2013.01); *H01L 27/10844* (2013.01); *H01L 27/10847* (2013.01); *H01L 29/7841* (2013.01);

(Continued)

(58) Field of Classification Search
CPC ................................................. G11C 2211/4016
USPC .................................................. 365/182, 150
See application file for complete search history.

(56) References Cited

U.S. PATENT DOCUMENTS 4,021,835 A * 5/1977 Etoh et al. ..................... 257/404
4,276,095 A * 6/1981 Beilstein et al. .............. 438/289

(Continued)

FOREIGN PATENT DOCUMENTS

| JP | 2003068877 A | 3/2003 |
|---|---|---|
| JP | 2007073680 A | 3/2007 |

(Continued)

OTHER PUBLICATIONS

International Search Report of International Application No. PCT/FR2011/050788.

(Continued)

*Primary Examiner* — Son Mai
(74) *Attorney, Agent, or Firm* — Kaplan Breyer Schwarz & Ottesen, LLP

(57) ABSTRACT

The invention relates to a memory cell consisting of an isolated MOS transistor having a drain (8), a source (7) and a body region covered with an insulated gate (12), in which the body region is divided through its thickness into two separate regions (13, 14) of opposite conductivity types extending parallel to the plane of the gate, the body region closest to the gate having the opposite conductivity type to that of the drain/source.

18 Claims, 2 Drawing Sheets

(51) Int. Cl.
  *H01L 21/84* (2006.01)
  *H01L 27/108* (2006.01)
  *G11C 7/00* (2006.01)

(52) U.S. Cl.
  CPC ... *G11C 2211/4016* (2013.01); *H01L 27/10826* (2013.01)

(56) References Cited

U.S. PATENT DOCUMENTS

| | | | |
|---|---|---|---|
| 4,596,068 A * | 6/1986 | Peters, Jr. | 438/189 |
| 4,819,043 A * | 4/1989 | Yazawa et al. | 257/346 |
| 5,118,632 A * | 6/1992 | Schrantz | 438/194 |
| 5,580,799 A * | 12/1996 | Funaki | 438/291 |
| 5,583,361 A * | 12/1996 | Morishita | 257/345 |
| 5,698,884 A * | 12/1997 | Dennen | 257/345 |
| 6,245,607 B1 * | 6/2001 | Tang et al. | 438/217 |
| 6,555,872 B1 * | 4/2003 | Dennen | 257/327 |
| 7,442,971 B2 * | 10/2008 | Wirbeleit et al. | 257/287 |
| 7,880,239 B2 * | 2/2011 | Wirbeleit | 257/393 |
| 2007/0176246 A1 * | 8/2007 | Wirbeleit et al. | 257/404 |
| 2008/0303063 A1 | 12/2008 | Hong et al. | |
| 2009/0251966 A1 | 10/2009 | Widjaja | |

FOREIGN PATENT DOCUMENTS

| | | |
|---|---|---|
| JP | 2009033149 A | 2/2009 |
| WO | 8808617 A1 | 11/1988 |
| WO | 2010119224 A1 | 10/2010 |

OTHER PUBLICATIONS

Noel Rodriguez, et al.: "A-RAM: Novel capacitor-less DRAM memory," SOI Conference, 2009 IEEE International, Oct. 5, 2009, pp. 1-2.

T. Tanaka, et al.: "Scalability study on a capacitor less 1T-DRAM from single-gate PD-SOI to double-gate FinDRAM," Electron Devices Meeting, 2004 IEDM Technical Digest, Dec. 13, 2004, pp. 919-922.

Simin Baharlou, "International Preliminary Report on Patentability," dated Oct. 9, 2012, for corresponding PCT International Application No. PCT/FR2011/050788.

"Office Action", dated Jan. 13, 2015, issued in counterpart JP Application No. 2013-503163.

* cited by examiner

WR1     WR0     RD

RAM MEMORY CELL COMPRISING A TRANSISTOR

BACKGROUND

The present invention relates to a single-transistor RAM cell.

DISCUSSION OF THE RELATED ART

Historically, DRAM cells have been formed of an assembly comprising a MOS transistor and a capacitor. As integrated circuits have miniaturized, it has been possible to decrease the dimensions of MOS transistors, and the issue has been to decrease the capacitor size. To overcome this difficulty, memory cells formed of a single transistor, with no capacitor, have been provided, the MOS transistor having its bulk insulated by a junction, or its bulk insulated by an insulator in semiconductor-on-insulator (SOI) or semiconductor-on-nothing (SON) technologies. In such memory cells, the memorization corresponds to a charge storage in the transistor. This has resulted in an increased miniaturization of DRAM cells. However, the various known capacitor-less memory cells generally suffer from one at least of the following disadvantages: limited retention time, high consumption, low differentiation between the two storage states, complexity of control, use of two gates, low operating speed, impossibility of decreasing the thickness of the transistor bulk, which must ensure the simultaneous presence of electrons and holes, and/or difficulty of manufacturing.

SUMMARY

Thus, an object of the invention is to provide a capacitor-less single-transistor RAM cell, which overcomes at least some of the disadvantages of known single-transistor memory cells.

Thus, an embodiment of the present invention provides a memory cell formed of an insulated MOS transistor having a drain, a source, and a bulk region coated with an insulated gate, wherein the bulk region is divided across its thickness in two different regions of opposite conductivity types extending parallel to the gate plane, the bulk region closest to the gate having a conductivity type opposite to that of the drain/source.

According to an embodiment of the present invention, the memory cell is formed from an SOI structure.

According to an embodiment of the present invention, the memory cell is supported by a semiconductor substrate having a conductivity type opposite to that of the drain/source.

According to an embodiment of the present invention, the memory cell is formed from a FINFET structure.

According to an embodiment of the present invention, the bulk region closest to the gate has a thickness ranging from 5 to 50 nm, preferably on the order of 10 nm, and a doping level smaller than $10^{16}$ at./cm$^3$.

According to an embodiment of the present invention, the bulk region most distant from the gate has a thickness ranging from 5 to 50 nm, preferably from 10 to 40 nm, and a doping level ranging between $10^{16}$ and $10^{18}$ at./cm$^3$.

An embodiment of the present invention provides a method for using the above memory cell, wherein the source voltage is considered as the reference voltage and the source and drain regions are of type N, this method comprising, in any order, the steps of:

writing of a 1: application of a positive voltage to the drain and, during the application of this positive voltage, application of a short positive voltage to the gate, writing of a 0: application of a very slightly positive, zero, or negative voltage to the drain and application of a positive voltage to the gate, reading: application of a negative voltage to the gate and of a slightly positive voltage to the drain, and holding: application of a negative voltage to the gate and of a slightly positive or zero voltage to the drain.

BRIEF DESCRIPTION OF THE DRAWINGS

The foregoing and other objects, features and advantages of the present invention will be discussed in detail in the following non-limiting description of specific embodiments in connection with the accompanying drawings, among which.

For clarity, the same elements have been designated with the same reference numerals in the different drawings and, as usual in the representation of integrated circuits, the various drawings are not to scale.

DETAILED DESCRIPTION

Figure 1:
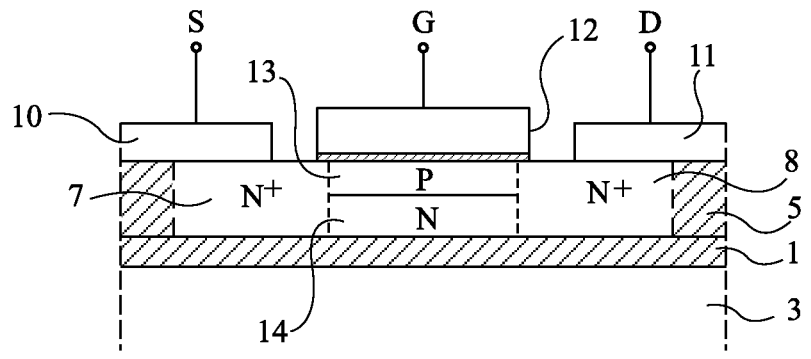
FIG. 1 is a simplified cross-section view of a memory cell according to an embodiment of the present invention.

FIG. 1 is a cross-section view illustrating a capacitor-less memory cell. This memory cell comprises a MOS transistor formed on an insulating layer 1 laid on a support 3, generally, a silicon wafer. The area taken up by the MOS transistor, or active area, is delimited by an insulating periphery 5. The MOS transistor comprises heavily-doped source and drain regions of a first conductivity type 7 and 8 separated by a bulk region. In the following, it will be considered that the first conductivity type is type N and that the second conductivity type is type P, although this should not be considered as limiting. The source and drain regions are respectively solid with a source metallization 10 and with a drain metallization 11 connected to source and drain terminals S and D. The bulk portion of the transistor is topped with an insulated gate 12 connected to a gate terminal G. The thickness of the bulk region is divided in an upper bulk region 13 on the side of gate 12 and a lower bulk region 14 in the vicinity of insulating layer 1. Upper bulk region 13 is of a conductivity type opposite to that of the drain/source and preferably has a doping level smaller than $10^{16}$ atoms/cm$^3$. Lower bulk region 14 is of the same conductivity type as the drain/source. Its doping level is preferably selected within a range from $10^{16}$ to $10^{18}$ atoms/cm$^3$ according to its thickness so that lower portion 14 is fully depleted at state 0 and that it contains enough available electrons at state 1, states 0 and 1 being defined hereafter.

The structure of FIG. 1 will preferably be formed by using technologies enabling to obtain layer thicknesses with an accuracy better than 5 nm, preferably on the order of one nm. Technologies where the lateral dimensions can be defined with minimum values lower than 50 nm will also be selected. Under such conditions, as an example only, it may be decided to form a structure where the total transistor thickness is smaller than 100 nm, the upper bulk region having a thickness ranging from 5 to 50 nm, preferably close to 10 nm, and the lower bulk region having a thickness ranging from 5 to 50 nm, and preferably from 10 to 40 nm. The channel length of the transistor will preferably be smaller than 65 nm, for example 35 nm.

The way in which the structure of FIG. 1 can be used as a memory cell will now be described in relation with FIGS. 2 to 4.

Figure 2A:
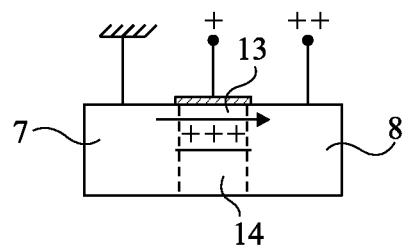
FIGS. 2A and 2B illustrate the writing of a 1 into a memory cell according to an embodiment of the present invention.
Figure 2B:
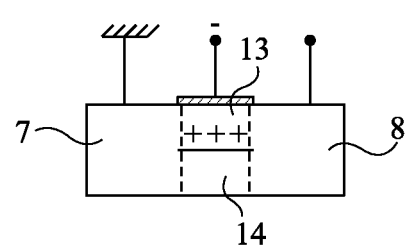

FIGS. 2A and 2B illustrates steps of writing of a 1 into the memory cell of FIG. 1. In the following, source S will be assumed to be permanently connected to a reference voltage which is designated, for simplicity, as being the ground.

To write a 1, as illustrated in FIG. 2A, a relatively high positive voltage, for example from 1 to 3 volts, is first applied to the transistor drain, and the gate is set to a positive voltage for a short time, while the positive voltage is applied to the drain. As a result, a channel region is formed in the upper bulk region (during this phase, a small proportion of current may flow in the lower bulk region with no inconvenience) and electrons flow from the source to the drain. Given that the drain-source potential difference is selected to be relatively high, these electrons will create, by impact, electron-hole pairs in the upper bulk region. The created electrons take part in the current flow and the holes remain in the upper bulk region. If the current flow between source and drain is abruptly interrupted (FIG. 2B), by switching the gate to a negative voltage before switching the drain, holes designated by signs + in FIGS. 2A and 2B will remain in upper bulk region 13.

Figure 3:
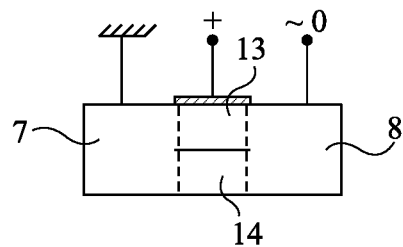
FIG. 3 illustrates the writing of a 0 into a memory cell according to an embodiment of the present invention.

FIG. 3 illustrates the writing of a 0 into the memory cell. Again, the gate is made positive, but this time, drain 8 is connected to a slightly positive, zero, or even negative voltage. Then, the source-drain potential difference is insufficient to provide the creation of electron-hole pairs and, due to the electrostatic biasing created by the gate in upper bulk region 13, the holes that may be present in this upper bulk region will be drained off towards the drain and/or the source. Thus, the states of FIG. 2B and of FIG. 3 can be differentiated by the fact that in one case (writing of a 1), holes are stored in upper bulk region 13, and that in the other case (writing of a 0), no charge is stored in this upper bulk region.

Figure 4A:
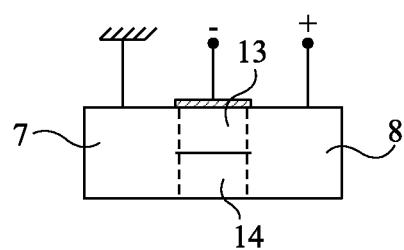
FIGS. 4A and 4B illustrate the reading, respectively of a 0 and of a 1, from a memory cell according to an embodiment of the present invention.
Figure 4B:
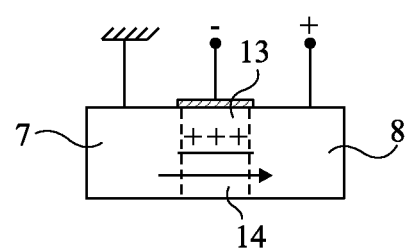

FIGS. 4A and 4B respectively illustrate the reading of a 0 and the reading of a 1 from the memory cell of FIG. 1. In read (or retention) phase, a negative voltage is maintained on the gate and a slightly positive voltage is maintained in the drain.

As illustrated in FIG. 4A, in the case where a 0 has been stored, that is, no charge is stored in upper bulk region 13, the transistors in parallel sharing a same drain and a same source are both off: no current flows through the transistor corresponding to the upper bulk region since the gate is negative, and the negative gate voltage depletes the lower bulk region, which thus allows no current to flow. It should be understood that the upper bulk region must be sufficiently thin for the stored charges to have a sufficient influence on the lower bulk region, which is why it this bulk region has been indicated to have a thickness preferably close to 10 nm.

However, as illustrated in FIG. 4B, in the case where a 1 has been written, that is, positive charges are stored in upper bulk region 13, no current flows through the transistor corresponding to this upper bulk region since the gate is negative and no electron channel region is created in this upper bulk region. However, the positive charges stored in the upper bulk region shield the negative gate voltage and an electron current will flow through the transistor having regions 7 and 8 as a source and drain and non-depleted lower bulk region 14 as a bulk.

Thus, a state 1 can be distinguished from a state 0 by the flowing or not of a current during a read phase. It should be noted that these two states are very well differentiated since, during the reading of a 0, absolutely no current flows between the drain and the source. Due to the total lack of current flow during the presence of a state 0, the device has a very long retention time since, even during the reading of a state 1, a slight loss of charges stored in the upper bulk region occurs, and there will always be a marked difference between states 0 and 1.

It should also be noted that, due to the fact that during the read state, only a slightly positive voltage is applied to the drain, there is no charge creation by impact in the lower bulk region 14 during a reading.

Figures 5A, 5B, 5C:
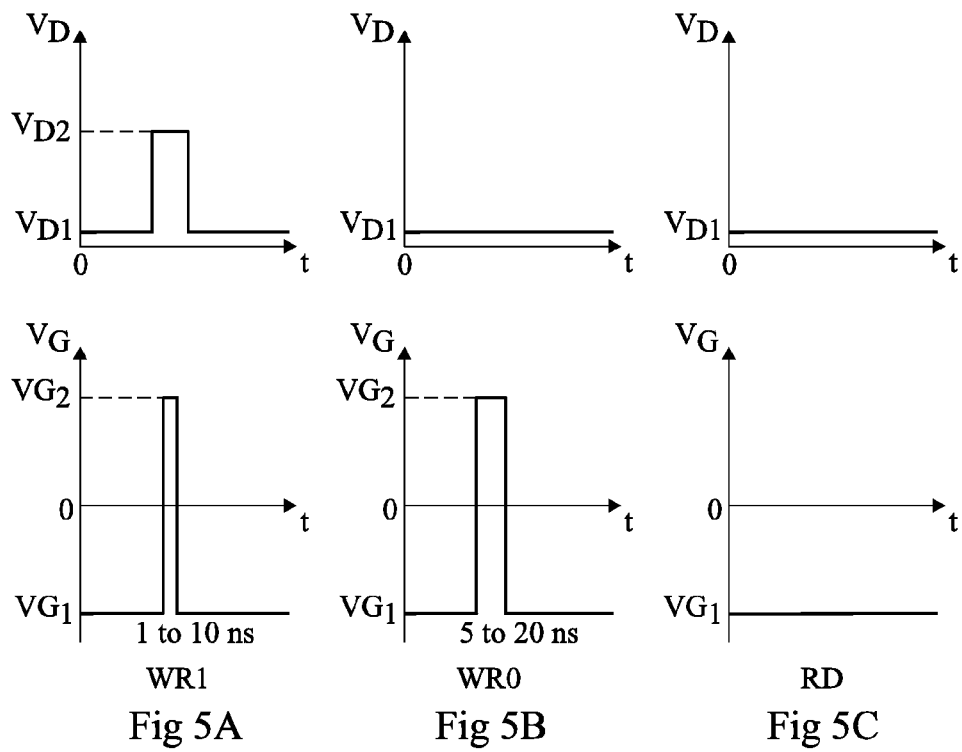
FIGS. 5A, 5B, and 5C illustrate voltages applied, respectively for the writing of a 1, the writing of a 0, and the reading in a memory cell according to an embodiment of the present invention.

To better illustrate the memory cell operation, each of FIGS. 5A, 5B, and 5C shows the variation of the drain (VD) and gate (VG) voltages, respectively during states of writing of a 1 (WR1), of writing of a 0 (WR0), and of reading (RD). During the writing of a 1 (FIG. 5A), the drain voltage is made to vary from a zero or slightly positive voltage VD1, for example, 0.1 V, to a clearly positive voltage VD2, for example, from 1 to 2.2 V and, during the period (for example, from 5 to 30 ns) for which drain voltage VD2 is applied, the gate is briefly (for example, for from 1 to 10 ns) taken from a negative voltage VG1 to a positive voltage VG2, for example, from −1.2 volt to +1 volt. For the writing of a zero (FIG. 5B), the drain voltage is maintained at low value VD1 and the gate is taken for a short period, for example, ranging from 1 to 10 nanoseconds, to a positive value to enable to drain off charges that may be present in the upper bulk region. In the read or retention state (FIG. 5C), the drain is maintained at low voltage value VD1 and the gate is maintained at its negative value VG1.

The voltage application mode described in relation with FIGS. 5A to 5C is particularly advantageous since it only provides two possible voltage levels on the gate and on the drain. More complex voltage switching modes may however be provided in which, for example, the drain voltage would be switchable between more than two voltage levels, for example a third zero or negative voltage level during the phase of writing of a 0, or a zero voltage level during the retention phase. During phases of writing of a 1, other phenomena than the creating of holes by impact ionization may be used. By applying a strongly negative voltage (for example, −2.5 V) to the gate, and a positive voltage to the drain, holes will be created by B to B tunneling or by activation of the parasitic bipolar transistor. The creation of holes by B to B tunneling is the preferred embodiment.

It should be noted that the voltage values indicated hereabove are purely indicative and are given for a memory cell substantially having the previously-indicated dimensions. It will be within the abilities of those skilled in the art to adapt these values to the specific characteristics of a specific component.

The forming of a structure such as that of FIG. 1 is particularly simple.

For example, it may be started from an SOI-type structure comprising, on a support 3 coated with an insulating layer 1, an N-type doped substrate having a lightly-doped P-type layer grown by epitaxy thereon. Then, or during an intermediate step, insulating periphery 5 surrounding the desired active area is formed, after which the conventional steps of forming of a gate oxide, of a gate, and of the source-drain regions are carried out.

The above-described memory cell is capable of having many alterations and modifications.

Figure 6:
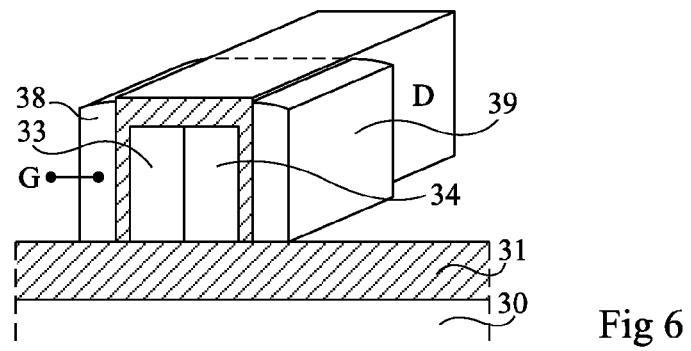
FIG. 6 is a simplified cross-section and perspective view of a variation of a memory cell according to an embodiment of the present invention.

FIG. 6 illustrates an embodiment according to a configuration generally called FINFET structure (fin field-effect transistor) in the art. This drawing is a cross-section and perspective view of the bulk portion and of the drain portion of the structure, the source portion, not shown, being ahead of the plane of the drawing. A fin-shaped silicon excrescence is formed above a wafer 30 coated with an insulating layer 31. This excrescence is divided in a left-hand portion 33 and a right-hand portion 34 respectively corresponding to upper bulk region 13 and to lower bulk region 14 of FIG. 1. Insulated gate metallizations 38 and 39 are arranged on either side of the fin, in front of left-hand bulk 33 and of right-hand bulk 34. The two gates 38 and 39 could be used to selectively invert the functions of the left-hand and right-hand bulk portions. Similarly, in the structure of FIG. 1, it may be provided to selectively bias support 3 to act on lower bulk region 14 through insulating layer 1, for example, to adjust the threshold voltage of the lower transistor. A lower gate may also be added.

Figure 7:
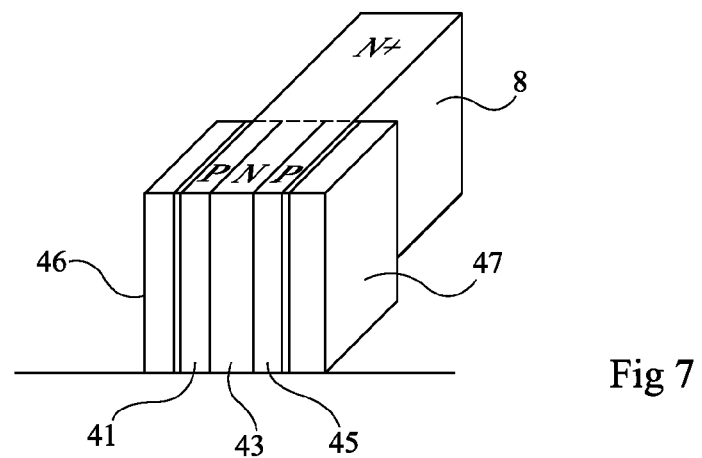
FIG. 7 is a simplified cross-section and perspective view of another variation of a memory cell according to an embodiment of the present invention.

FIG. 7 very schematically illustrates a FINFET embodiment of a variation of the structure of FIG. 1. The transistor bulk, instead of being divided in two regions, is divided in three regions: a P-type left-hand region 41, an N-type central region 43, and a P-type right-hand region 45. An insulated gate 46 is arranged in front of left-hand region 41 and an insulated gate 47 is arranged in front of right-hand region 45. A two-bit memory cell, that is, a four-state memory cell, is thus obtained. The left-hand gate enables to store or not charges in left-hand bulk region 41. The right-hand gate enables to store or not charges in right-hand bulk region 45. A first state (11) is obtained if charges are stored to the left and to the right, a second state (00) is obtained if no charge is stored, either to the left or to the right, a third state (10) is obtained if charges are stored to the left and not to the right, and a fourth state (01) is obtained if charges are stored in the right-hand region and not to the left. States (01) and (10) may be differentiated in various ways. In particular, if the left-hand and right-hand gates are different (different work function or different insulator thickness) and/or if the applied voltages are different, a variable amount of charges will be stored in the left-hand bulk region and in the right-hand bulk region for each writing of a 1. Thus, the four possible values of the current in the central bulk region can be well differentiated.

Specific embodiments of the present invention have been described. Various alterations, modifications, and improvements will occur to those skilled in the art. In particular, many variations of the forming of MOS transistors may be adopted, for example, the forming of lightly-doped source and drain areas (LDD) in the vicinity of the channel region.

It should also be understood that the fact of having called state 1 one of the storage states and state 0 the other storage state is totally arbitrary.

The foregoing relates to a transistor having two bulks: a bulk capable of storing charges of a first polarity and a bulk capable of conducting charges of opposite polarity. There thus is no coexistence of charges of opposite polarity in a same bulk. This is one of the main reasons for which the described structure avoids the above-mentioned disadvantages of prior art single-transistor memory cells (limited retention time, high consumption, low differentiation between the two storage states, complexity of control, low operating speed, impossibility to decrease the thickness of the transistor bulk which must ensure the simultaneous presence of electrons and of holes). Further, the described device can operate with a single gate and is relatively simple to control.

Various embodiments and variations of a memory cell with a single transistor have been described herein. Those skilled in the art may combine various elements of these various embodiments and variations without showing any inventive step.

In particular, in the embodiment described in detail hereabove, the insulated MOS transistor is insulated by an insulating layer 1. It may be provided for this MOS transistor to be insulated by junction, that is, to be directly formed above a silicon substrate of a conductivity type opposite to that of the drain/source regions, that is, a P-type substrate if the drain/source regions, like the lower bulk region, are of type N.

The invention claimed is:

1. A memory cell made of a MOS transistor formed in a semiconductive layer lying on an insulating layer having a drain, a source, and a central region over-laid by an insulated gate, wherein the central region is divided across its thickness in first and second regions of opposite conductivity types extending parallel to the gate plane, one of the first and second regions closest to the gate having a conductivity type opposite to that of the drain and the source, the other one of the first and second regions lying on the insulating layer and having a conductivity type that is the same as the conductivity type of the source and drain, wherein the one of the first and second regions closest to the gate has a thickness ranging from 5 to 50 nm and a doping level smaller than $10^{16}$ at./cm$^3$.

2. The memory cell of claim 1, formed from an SOI structure.

3. The memory cell of claim 1, wherein said insulating layer is supported by a semiconductor substrate having a conductivity type opposite to that of the drain and the source.

4. The memory cell of claim 1, formed from a FINFET structure.

5. The memory cell of claim 1, wherein the other one of the first and second regions is most distant from the gate and has a thickness ranging from 5 to 50 nm and a doping level ranging between $10^{16}$ and $10^{18}$ at./cm$^3$.

6. A method for using a memory cell formed of an insulated MOS transistor having a drain, a source, and a bulk region coated with an insulated gate, wherein the bulk region is divided across its thickness in two different regions of opposite conductivity types extending parallel to the gate plane, the bulk region closest to the gate having a conductivity type opposite to that of the drain/source, wherein the source voltage is considered as the reference voltage and the source and drain regions are of type N, this method comprising, in any order, the steps of:

writing of a 1: application of a positive voltage to the drain and, during the application of this positive voltage, application of a short positive voltage to the gate, writing of a 0: application of a very slightly positive, zero, or negative voltage to the drain and application of a positive voltage to the gate, reading: application of a negative voltage to the gate and of a slightly positive voltage to the drain, and holding: application of a negative voltage to the gate and of a slightly positive or zero voltage to the drain.

7. The memory cell of claim 1, wherein the one of the first and second regions closest to the gate has a thickness of 10 nm.

8. The memory cell of claim 1, wherein the other one of the first and second regions is most distant from the gate has a thickness ranging from 10 to 40 nm and a doping level ranging between $10^{16}$ and $10^{18}$ at./cm$^3$.

9. A memory cell made of a MOS transistor formed in a semiconductive layer lying on an insulating layer having a drain, a source, and a central region over-laid by an insulated gate, wherein the central region is divided across its thickness in first and second regions of opposite conductivity types extending parallel to the gate plane, one of the first and second regions closest to the gate having a conductivity type opposite to that of the drain and the source, the other one of the first and second regions lying on the insulating layer and having a conductivity type that is the same as the conductivity type of the source and drain, wherein the memory cell is formed from a FINFET structure.

10. The memory cell of claim 9, wherein the one of the first and second regions closest to the gate has a thickness ranging from 5 to 50 nm and a doping level smaller than $10^{16}$ at./cm$^3$.

11. The memory cell of claim 9, wherein the other one of the first and second regions is most distant from the gate and has a thickness ranging from 5 to 50 nm and a doping level ranging between $10^{16}$ and $10^{18}$ at./cm$^3$.

12. The memory cell of claim 9, wherein the one of the first and second regions closest to the gate has a thickness of 10 nm.

13. The memory cell of claim 9, wherein the other one of the first and second regions is most distant from the gate has a thickness ranging from 10 to 40 nm and a doping level ranging between $10^{16}$ and $10^{18}$ at./cm$^3$.

14. A memory cell made of a MOS transistor formed in a semiconductive layer lying on an insulating layer having a drain, a source, and a central region over-laid by an insulated gate, wherein the central region is divided across its thickness in first and second regions of opposite conductivity types extending parallel to the gate plane, one of the first and second regions closest to the gate having a conductivity type opposite to that of the drain and the source, the other one of the first and second regions lying on the insulating layer and having a conductivity type that is the same as the conductivity type of the source and drain, wherein the other one of the first and second regions is most distant from the gate and has a thickness ranging from 5 to 50 nm and a doping level ranging between $10^{16}$ and $10^{18}$ at./cm$^3$.

15. A memory cell made of a MOS transistor formed in a semiconductive layer lying on an insulating layer having a drain, a source, and a central region over-laid by an insulated gate, wherein the central region is divided across its thickness in first and second regions of opposite conductivity types extending parallel to the gate plane, one of the first and second regions closest to the gate having a conductivity type opposite to that of the drain and the source, the other one of the first and second regions lying on the insulating layer and having a conductivity type that is the same as the conductivity type of the source and drain, wherein the one of the first and second regions closest to the gate has a thickness of 10 nm and a doping level smaller than $10^{16}$ at./cm$^3$.

16. The memory cell of claim 15, wherein the other one of the first and second regions is most distant from the gate and has a thickness ranging from 5 to 50 nm and a doping level ranging between $10^{16}$ and $10^{18}$ at./cm$^3$.

17. The memory cell of claim 15, wherein the other one of the first and second regions is most distant from the gate has a thickness ranging from 10 to 40 nm and a doping level ranging between $10^{16}$ and $10^{18}$ at./cm$^3$.

18. A memory cell made of a MOS transistor formed in a semiconductive layer lying on an insulating layer having a drain, a source, and a central region over-laid by an insulated gate, wherein the central region is divided across its thickness in first and second regions of opposite conductivity types extending parallel to the gate plane, one of the first and second regions closest to the gate having a conductivity type opposite to that of the drain and the source, the other one of the first and second regions lying on the insulating layer and having a conductivity type that is the same as the conductivity type of the source and drain, wherein the other one of the first and second regions is most distant from the gate has a thickness ranging from 10 to 40 nm and a doping level ranging between $10^{16}$ and $10^{18}$ at./cm3.

\* \* \* \* \*